Figure 3:
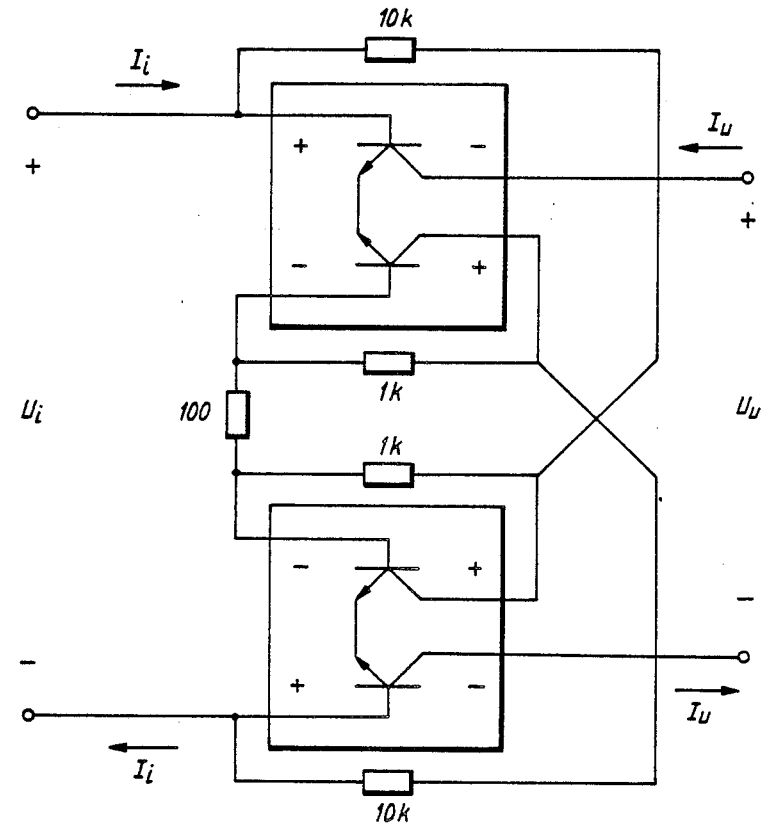
Figure 3:
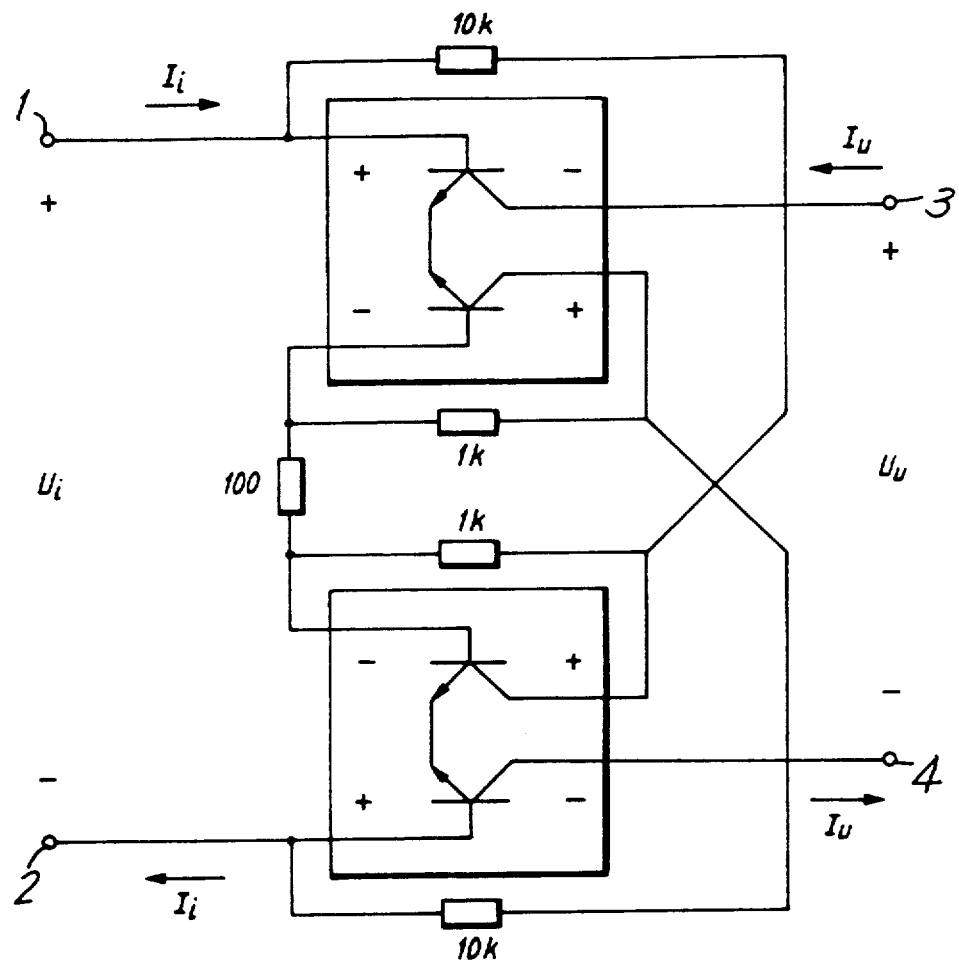

United States Patent [19]

Van Zeijl

[11] Patent Number: 4,897,610

[45] Date of Patent: Jan. 30, 1990

[54] NEGATIVE-FEEDBACK AMPLIFIER WITH ACCURATELY DEFINED INPUT OR OUTPUT IMPEDANCE COMBINED WITH HIGH OR LOW OUTPUT OR INPUT IMPEDANCE RESPECTIVELY

[75] Inventor: Paulus T. M. Van Zeijl, Monster, Netherlands

[73] Assignee: Stichting Voor De Technische Wetenschappen, GA Utrecht, Netherlands

[21] Appl. No.: 187,597

[22] Filed: Apr. 28, 1988

[30] Foreign Application Priority Data

Apr. 29, 1987 [NL] Netherlands .................. 8701026

[51] Int. Cl.[4] ......................................... H03F 1/34
[52] U.S. Cl. ................................. 330/84; 330/102; 330/103; 330/105
[58] Field of Search ............... 330/84, 102, 103, 105, 330/124 R, 146, 295

[56] References Cited

U.S. PATENT DOCUMENTS

| | | | |
|---|---|---|---|
| 3,260,947 | 7/1966 | Dorsman | 330/258 |
| 3,516,006 | 6/1970 | Donjon | 330/84 X |
| 3,566,298 | 2/1971 | Stevens | 330/84 |

FOREIGN PATENT DOCUMENTS

| | | |
|---|---|---|
| 2649965 | 10/1976 | Fed. Rep. of Germany . |
| 0121808 | 7/1983 | Japan .................. 330/84 |
| 6803097 | 9/1968 | Netherlands . |

OTHER PUBLICATIONS

Hadley, "Isolation Amplifier", *Wireless World*, Jun.-1981, vol. 87, No. 1545, p. 67.
Huijsing et al., "Monolithic Nullor-A Universal Acitve Network", IEEE J. of Solid-State Circuits, vol. SC-12, No. 1, Feb. 1977, pp. 59–64.
Schwartz, "Transactors as Basic Linear Active Network Elements", *Tijoschrift Van Het Nederlands Electronica-en Radiagenootechap*, vol. 32, No. 2, 1967, pp. 45–54.
Electronik, vol. 21, No. 1, Jan. 1872, pp. 33–36.
Yanagisawa et al., "Realization of Arbitrary Conductance Matrix Using Operational Amplifiers" Electronics and Communications in Japan, vol. 59-A, No. 5, May 1976, pp. 45–52.

*Primary Examiner*—James B. Mullins
*Attorney, Agent, or Firm*—Rosen, Dainow & Jacobs

[57] ABSTRACT

Negative-feedback amplifier provided with an active amplifier section operating approximately as a nullor and a negative feedback section, the amplifier having a high loop gain. The active amplifier section is constructed in balanced form with two nullors connected in balance, and the negative-feedback section is composed of passive impedances and comprises two negative-feedback loops. In one embodiment each nullor has a series-coupling circuit and a parallel-coupling circuit at the input port. As a result an accurately defined or characteristic input impedance is obtained, and a series- or parallel-coupling circuit is formed in both negative-feedback loops at the output port, so that a high (current output) or low (voltage output) output impedance, respectively is obtained. In another embodiment each nullor has a series-coupling circuit and a parallel-coupling circuit at the output port. As a result an accurately defined or characteristic output impedance is obtained at the amplifier, and a current or voltage related both to the output current and voltage is fed to the input port, so that a low (current input) or high (voltage input) input impedance, respectively is obtained.

8 Claims, 6 Drawing Sheets

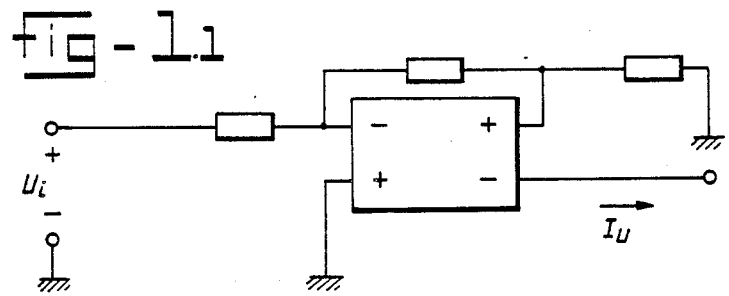
fig-1.1
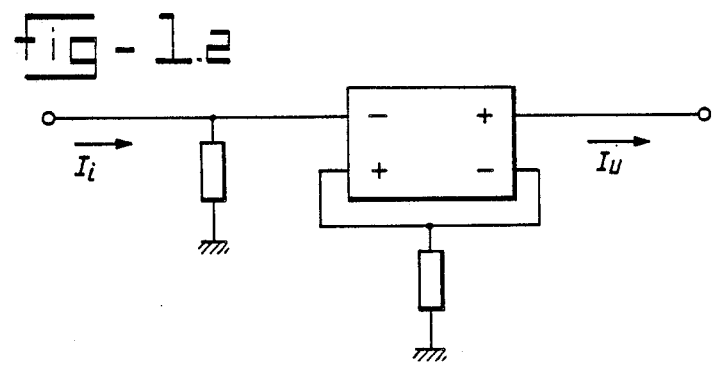
fig-1.2
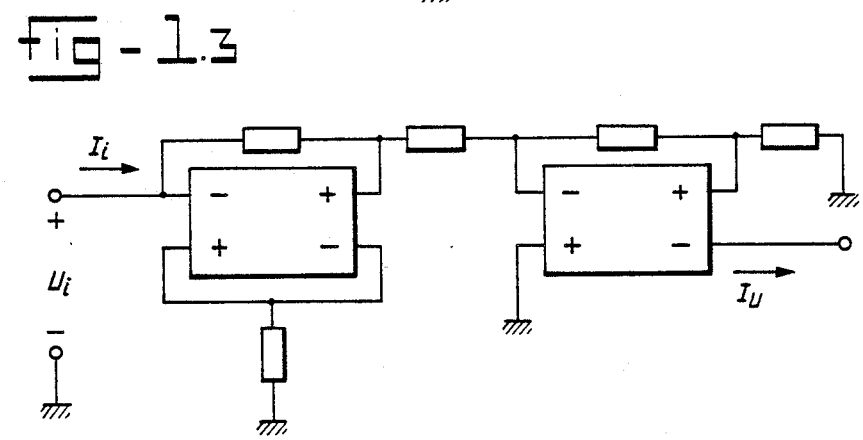
fig-1.3
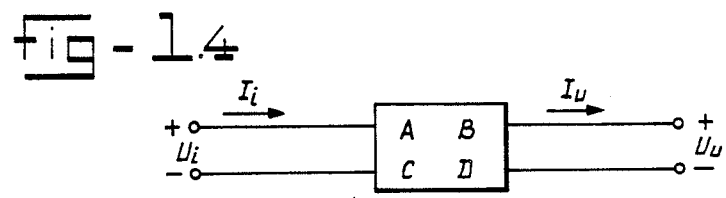
fig-1.4

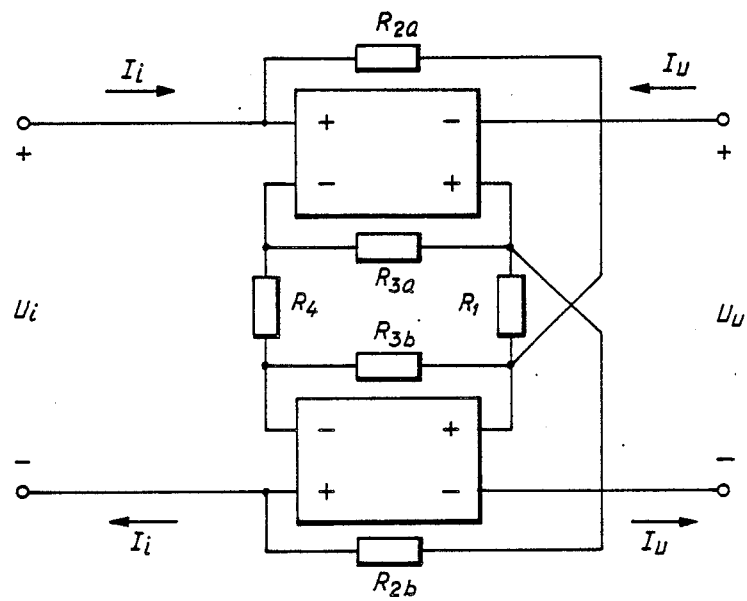
fig-2.1
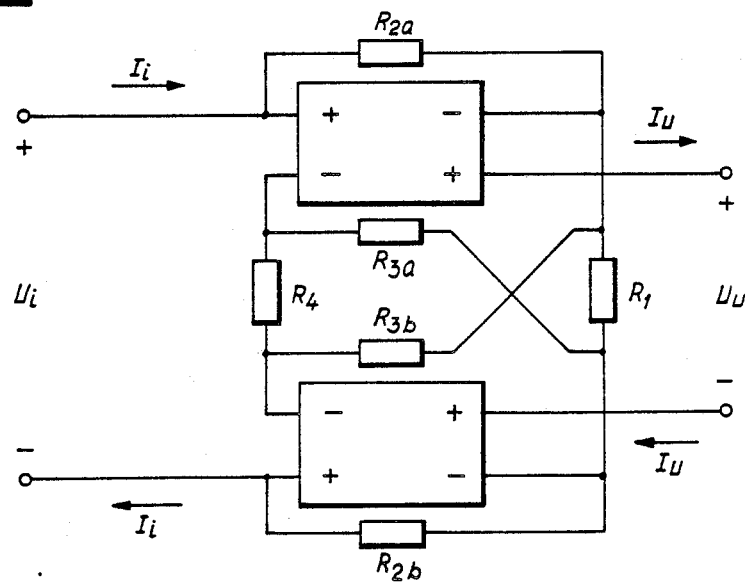
fig-2.2

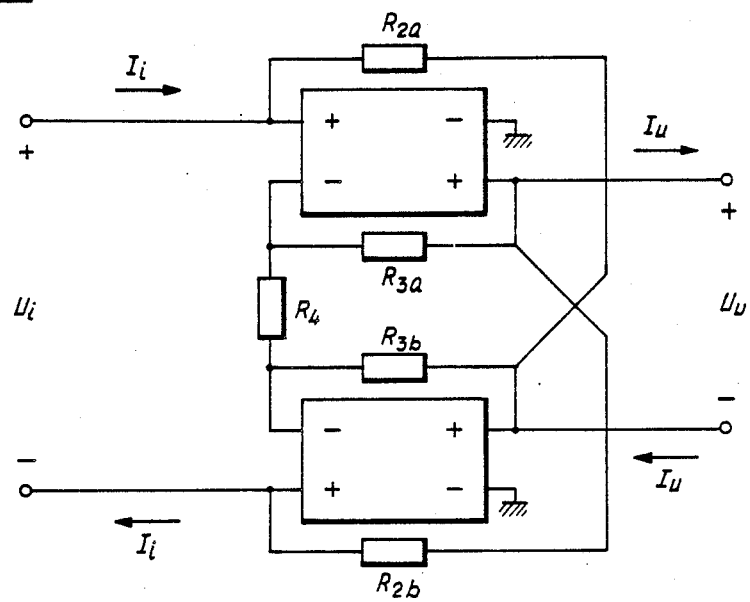
fig-2.3
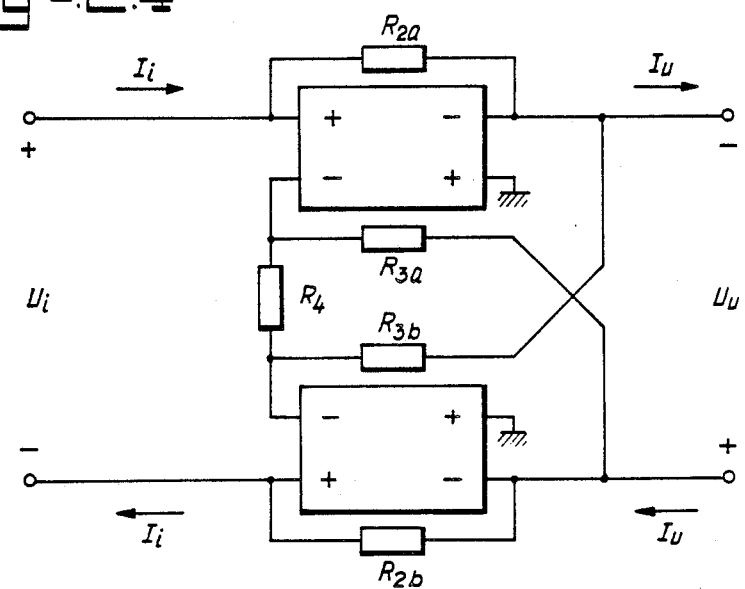
fig-2.4

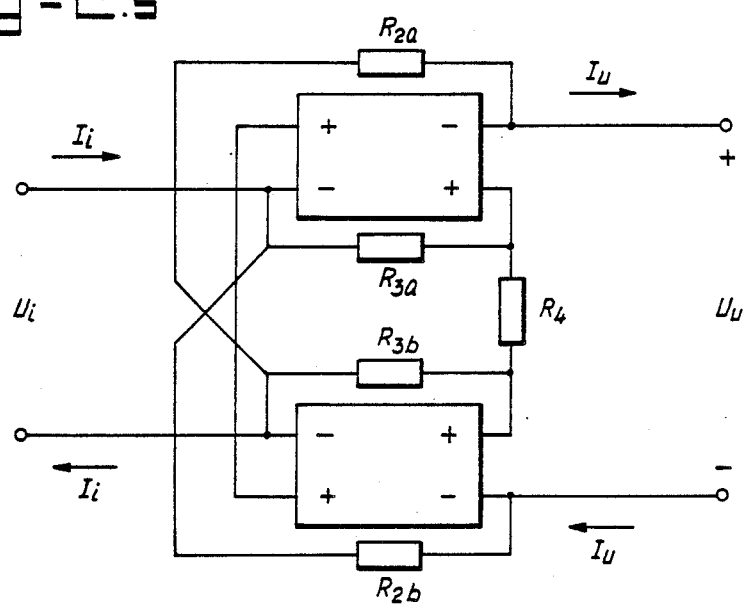
fig-2.5
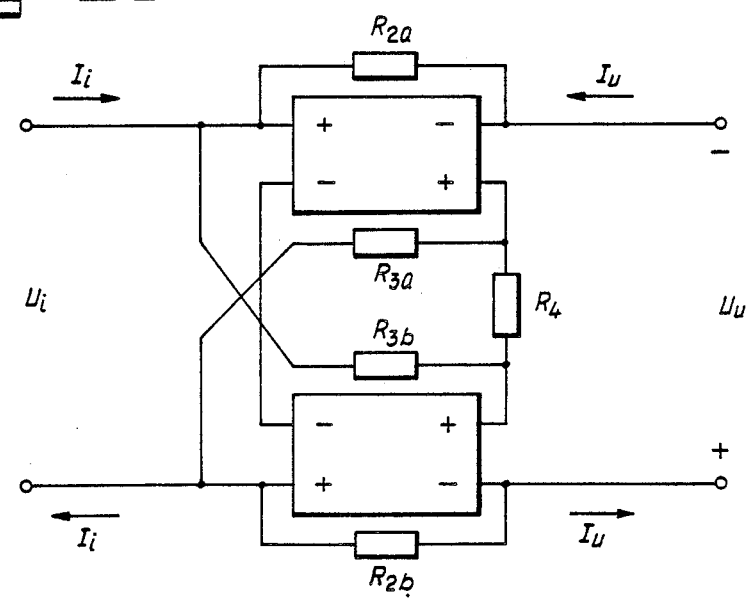
fig-2.6

Fig-2.7
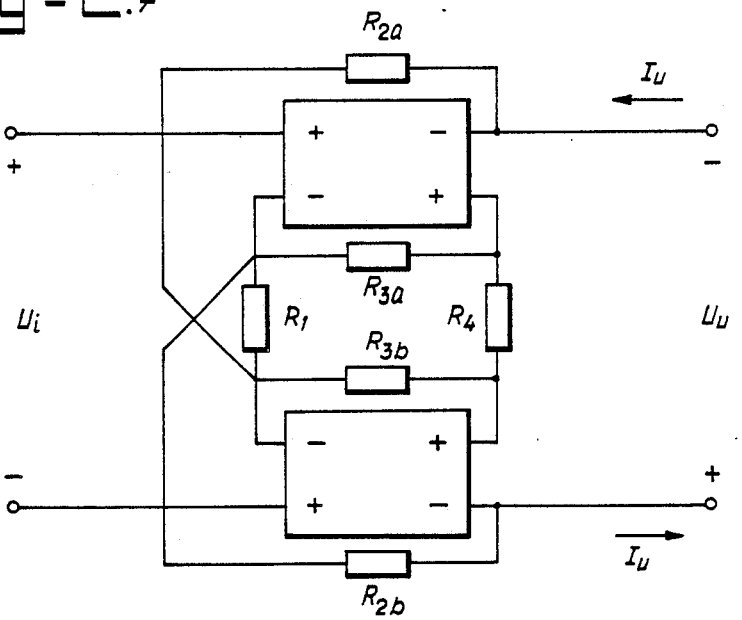
Fig-2.8
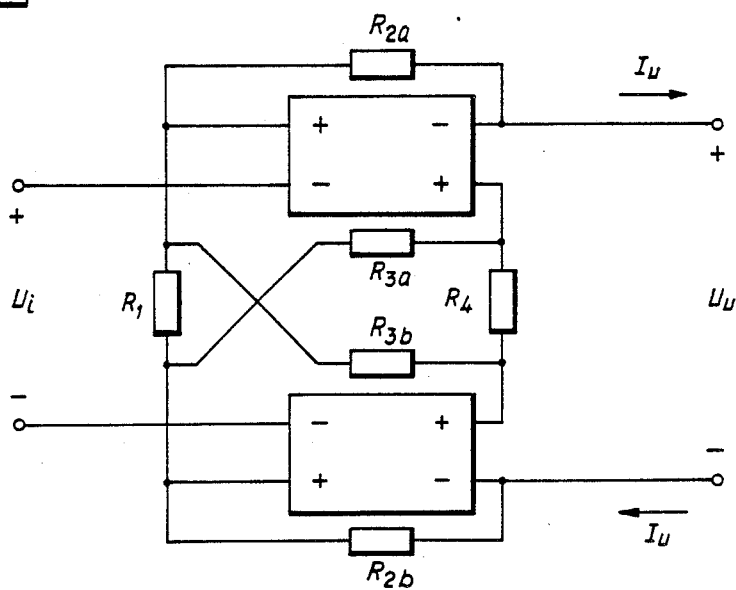

NEGATIVE-FEEDBACK AMPLIFIER WITH ACCURATELY DEFINED INPUT OR OUTPUT IMPEDANCE COMBINED WITH HIGH OR LOW OUTPUT OR INPUT IMPEDANCE RESPECTIVELY

The invention relates to a negative-feedback amplifier having an active amplifier section operating approximately as a null or and a negative-feedback section, the amplifier having a high loop gain. Such a negative-feedback amplifier is known from the book entitled "The design of high-performance negative-feedback amplifiers" by E. H. Nordholt, published by Elsevier, Amsterdam 1983.

In general, an optimum information transfer and a maximum power transfer is required in the amplification of signals from signal sources such as aerials, filters, transmission lines and the like. In this case, the desired terminating resistance or the input resistance of the amplifier has to be equal to the characteristic resistance of the source. A high output impedance is often desired at the output of the amplifier in connection with the current input nature of the subsequent mixing stage.

For correct matching, such a signal source can be terminated in a simple manner with a resistor, the current through which or the voltage across which is then amplified by a current amplifier or transadmittance amplifier so that a high output impedance is obtained. An important disadvantage in this connection is the additional noise which is added to the signal by the resistor. The effect of said noise can be reduced by first considerably amplifying the signal with a characteristic impedance amplifier. The disadvantage of this is that two amplifiers are used instead of one. It is also a problem that considerable amplification is not always permitted in view of the limitation on the available supply voltage.

In the abovementioned book, amplifiers are indicated in which an accurately defined input impedance and a high or low output impedance is obtained by means of the transformer incorporated in a negative-feedback loop. The transformers used in this connection are, however, not capable of integration and cannot therefore be used in integrated circuits.

The object of the invention is therefore to provide a negative-feedback amplifier which has an accurately defined impedance at the input or the output and an extreme impedance, such as a high or low impedance, at the output, or input respectively, combined with very good noise performance and power efficiency and which is suitable for integration.

According to the invention, this is achieved in an amplifier of the type mentioned in the introduction in a first embodiment in that the active amplifier section is constructed in balanced form with two nullors connected in balance, and in that the negative-feedback section is composed of passive impedances and comprises two negative-feedback loops, such that each nullor has a series-coupling circuit and a parallel-coupling circuit at the input port, as a result of which an accurately defined or characteristic input impedance is obtained at the amplifier, and such that a series- or parallel-coupling circuit is formed in both negative-feedback loops at the output port, as a result of which a high (current output) or low (voltage output) output impedance, respectively, is obtained.

According to the invention, this is additionally achieved in an amplifier of the type mentioned in the introduction in a second embodiment such that the active amplifier section is constructed in balanced form with two nullors connected in balance and in that the negative-feedback section is composed of passive impedances and comprises two negative-feedback loops, such that each nullor has a series-coupling circuit and a parallel-coupling circuit at the output port, as a result of which an accurately defined or characteristic output impedance is obtained at the amplifier, and such that a current or voltage related both to the output current and voltage is fed to the input port, as a result of which a low (current input) or high (voltage input) input impedance, respectively, is obtained.

It is also known from the above book that an amplifier having either an active negative feedback or an indirect negative feedback is used in order to obtain an accurate input impedance and a high or low output impedance. These amplifiers are then capable of integration. In the case of an active negative feedback, an active component is used in the negative-feedback section, and this is a drawback. In the case of an indirect negative feedback, it is not the output signal of the active output of the amplifier, but the output signal of the inactive output of the amplifier which is fed back. The important transfer parameters of these two outputs have therefore to be equally large and (non) linear to the same extent. The big disadvantage of both amplifiers is the appreciable noise as a result of the negative-feedback component and the deformation of the signal brought about by said component.

The invention will be explained on the basis of exemplary embodiments with reference to the drawings, in which:

FIGS. 1.1, 1.2 and 1.3 illustrate examples of state-of-the-art amplifiers, and

FIG. 1.4 illustrates the general diagram of a two-port network;

FIGS. 2.1 and 2.2 illustrate an example of a balanced amplifier according to the invention with characteristic input impedance and high output impedance (current output);

FIGS. 2.3 and 2.4 illustrate an example of a balanced amplifier according to the invention with characteristic input impedance and low output impedance (voltage output);

FIGS. 2.5 and 2.6 illustrate an example of a balanced amplifier according to the invention with low input impedance (current input) and characteristic output impedance;

FIGS. 2.7 and 2.8 illustrate an example of a balanced amplifier according to the invention with high input impedance (voltage input) and characteristic output impedance; and FIG. 3 illustrates a practical exemplary embodiment of the amplifier of FIG. 2.1.

FIGS. 1.1 and 1.2 indicate how a source can be terminated with a resistor in a very simple manner. The current through the resistor (FIG. 1.1) or the voltage across the resistor (FIG. 1.2) can be amplified with a current amplifier (nullor in FIG. 1.1) or a transadmittance amplifier (nullor in FIG. 1.2) respectively so that a high output impedance is obtained. In these cases, the transfer of the amplifier is determined only by the (passive) negative-feedback components. As stated earlier, an important disadvantage of terminating the source, such as a filter, with a resistor is that the noise of said resistor worsens the signal/noise ratio. It is possible to reduce the effect of said noise by considerably amplifying the signal with a characteristic impedance amplifier as indicated in FIG. 1.3. However, two amplifiers then have to be used instead of one. A second amplifier cannot, however, always be used in view of the limitation on the available supply power.

From the book mentioned earlier it is known that negative-feedback amplifiers are used with which input and output impedances of the amplifier respectively can be matched to the signal source and to the load. In order to obtain a signal transfer of high quality, input and output impedances are required in this case which are essentially very large or very small, or linear and accurately known. By taking the correct type of negative feedback, these requirements can be satisfied without the noise performance and the power efficiency being substantially reduced.

It is then possible to choose a type of amplifier which provides the best possible signal transfer for any combination of a given source and load. In this case, the starting point is an active amplifier section of the amplifier which provides an infinite loop gain since in that case transfer properties the amplifier are completely determined by the properties of the negative-feedback section. FIG. 1.4 indicates the circuit of a two-port network to which the following iterative matrix applies:

$$\begin{bmatrix} U_i \\ I_i \end{bmatrix} = \begin{bmatrix} A & B \\ C & D \end{bmatrix} \begin{bmatrix} U_u \\ I_u \end{bmatrix} \quad \begin{array}{l} U_i = AU_u + BI_u \\ I_i = CU_u + DI_u \end{array}$$

with A, B, C and D as transmission parameters. The transfer parameters derived from these parameters are specified below and are derived in the following manner:

$\mu = 1/A = [U_u/U_i]_{I_u=0}$ (=voltage gain)
$\gamma = 1/B = [I_u/U_i]_{U_u=0}$ (=transadmittance)
$\xi = 1/C = [U_u/I_i]_{I_u=0}$ (=transimpedance)
$\alpha = 1/D = [I_u/I_i]_{U_u=0}$ (=current gain)

For a nullor the following then applies:
A, B, C, D —> o
or $\mu, \gamma, \xi, \alpha$, —> ∞

From a derivation via impedance transformation for two-port networks, it emerges that:
the input impedance: $Z_i = (AZ_1+B)/(CZ_1+D)$, where $Z_1$ is the load impedance; and
the output impedance: $Z_u = (B+DZ_s)/(A+CZ_s)$, where $Z_s$ the source impedance.

The inventor has now found that by making use of a balanced amplifier with two negative-feedback loops, containing only passive impedances, between two nullors connected in balance, an accurately defined input impedance is obtained at the input and an extreme, i.e. a high or low, output impedance is obtained at the output, or vice versa. This is possible because, in the amplifier sections connected in balance, the inverted signal is also directly present, just as is the case in the negative-feedback amplifier with transformer and the amplifier with active or indirect feedback. Here the negative-feedback component chiefly functions as a signal inverter.

In the subsequent figures, examples are indicated of amplifiers according to the invention in which the passive impedances consist of resistors. It is clear that the passive impedances may also comprise capacitors, coils or combinations thereof.

FIGS. 2.1 and 2.2 show a balanced amplifier with accurately defined or characteristic input impedance, in which the output current is sensed in the two negative-feedback loops and both a voltage and a current derived from the output current are fed back to the input port, as a result of which a high output impedance (current output) is obtained. In this case the amplifier is embodied in two ways and the following formulae are applicable to the transfer parameters and input and output impedances:

$\gamma = 1/R_4[1+(R_{3a}+R_{3b}+2R_4)/(R_{2a}+R_{2b})+(-R_{3a}+R_{3b}+R_4)/R_1]$ $\alpha = [1+(R_{2a}+R_{2b})/(R_{3a}+R_{3b}+2R_4)(1+(R_{3a}+R_{3b}+R_4)/R_1)]$ $Z_i = (R_{2a}+R_{2b})R_4/(R_{3a}+R_{3b}+2R_4); Z_u = \infty$ $\mu = \infty; \rho = \infty$ As also emerges from the formula for $Z_i$, the resistor $R_1$ in FIG. 2.1 and 2.2 is of no importance for the characteristic input impedance $Z_i$ and the output impedance $Z_u$.

In the amplifier of FIG. 2.1 the series-coupling circuit is directly connected to one nullor while the parallel-coupling circuit leads to the other nullor. In the amplifier of FIG. 2.2, the parallel-coupling circuit is directly connected to one nullor, while the series-coupling circuit leads to the other nullor.

FIGS. 2.3 and 2.4 show a balanced amplifier with an accurately defined or characteristic input impedance in which the output voltage is sensed in two negative-feedback loops and both a current and a voltage, derived from the output voltage, is fed back to the input port, as a result of which a low output impedance (voltage output) is obtained. The amplifier is again embodied in two ways. The following formulae apply to the transfer parameters and the input an output impedances:

$\mu = 1+(R_{3a}+R_{3b})/R_4$ $\xi = (R_{2a}+R_{2b})(R_{3a}+R_{3b}+R_4)/(R_{3a}+R_{3b}+2R_4)$ $Z_i = (R_{2a}+R_{2b})R_4/(R_{3a}+R_{3b}+2R_4); Z_u = 0$ $\gamma = \infty; \alpha = \infty$ By interchanging the inputs and outputs of the nullors used in the amplifiers of FIGS. 2.1 to 2.4 inclusive, amplifiers are obtained with a low or high input impedance (current or voltage input) and an accurately defined (characteristic) output impedance. This version of the amplifiers provides a maximum voltage/current swing capacity at the output which is doubled with respect to the known amplifiers having a characteristic output impedance which is obtained by means of series or parallel resistors at the output.

FIGS. 2.5 and 2.6 show a balanced amplifier with accurately defined or characteristic output impedance in which the output current and the output voltage are sensed in both negative-feedback loops and a current is derived therefrom which is fed back to the input port, as a result of which a low input impedance (current input) is obtained. The amplifier is again embodied in two ways. The following formulae apply to the transfer parameters and the input and output impedance:

$\alpha = 1+(R_{3a}+R_{3b})/R_4$ $\xi = (R_{2a}+R_{2b})(R_{3a}+R_{3b}+R_4)/(R_{3a}+R_{3b}+2R_4)$ $Z_u = (R_{2a}+R_{2b})R_4/(R_{3a}+R_{3b}+2R_4); \; Z_i = 0$ $\gamma = \infty; \; \mu = \infty$ FIGS. 2.7 and 2.8 show a balanced amplifier with accurately defined or characteristic output impedance, in which the output current and the output voltage are sensed in the two negative-feedback loops and a voltage is derived therefrom which is fed back to the input port, as a result of which a high input impedance (voltage input) is obtained. Here too the amplifier is again embodied in two ways. The following formulae apply to the transfer parameters and the input and output impedances:

$\gamma = 1/R_4 \cdot [1+(R_{3a}+R_{3b}+2R_4)/(R_{2a}+R_{2b})+(-R_{3a}+R_{3b}+R_4)/R_1]$ $\mu = [1+(R_{2a}+R_{2b})/(R_{3a}+R_{3b}+2R_4)\\(1+(R_{3a}+R_{3b}+R_4)/R_1)]$ $Z_u = (R_{2a}+R_{2b})R_4/(R_{3a}+R_{3b}+2R_4); \; Z_i = \infty$ $\alpha = \infty; \; \rho = \infty$ In the amplifier of FIG. 2.7 and 2.8 it is again also true that the resistor R1 is not really of importance and does not occur in the input and output impedance. Because there is no resistor present in series or in parallel at the output which corresponds to the output impedance, the amplifier has a larger signal handling (voltage/current swing) capacity or the power consumption from the supply can continue to be limited with respect to known amplifiers.

FIG. 3 indicates a practical exemplary embodiment of the amplifier type according to the invention indicated in FIG. 2.1.

The four amplifiers mentioned (FIGS. 2.1/2, 2.3/4, 2.5/6 and 2.7/8) can each be embodied in two ways. As stated earlier, the advantages with respect to the existing amplifiers are that they are capable of integration and are of balanced construction. Because the negative-feedback loops of the present amplifiers are composed only of passive impedances, a very linear transfer can be obtained in contrast to the known amplifier types with active or indirect negative feedback. The amplifier types of FIGS. 2.1 to 2.4 furthermore have a very low noise contribution to the signal transfer, while the amplifier types of FIGS. 2.5 to 2.8 are particularly important in view of the additional voltage/current swing capacity with the result that little or no efficiency loss occurs at the output.

The abovementioned balanced amplifiers are used with advantage in all applications in which a characteristic impedance termination or connection is desired, while a current or voltage input or output is desired. The balanced amplifiers can furthermore be used for terminating or driving LC and acoustic surface wave filters.

The balanced amplifiers can also be used with advantage in RC filters in which the accurate input impedance represents the R of the RC circuit. This R is then a resistor which has no, or virtually no, thermal noise (so-called cold resistor).

I claim:

1. A negative-feedback amplifier having an input and an output port providing an output current, which amplifier comprises:
   (1) an active amplifier section which has a high loop gain, active amplifier section including two nullor circuits, each operating approximately as a nullor circuit, said nullor circuits connected to each other in balance,
   (2) a negative-feedback section comprising passive impedance which form two negative-feedback loops in which the output current is sensed,
   said negative-feedback loops connected to said nullor circuits so as to form with each nullor circuit:
     (a) a parallel-coupling circuit at the input port to feed back a current, derived from the output current, to the input port and
     (b) a series-coupling circuit at the input port to feed back a voltage, derived from the output current, to the input port,
     whereby an accurately defined or characteristic input impedance and a high output impedance is produced.

2. A negative-feedback amplifier according to claim 1, characterized in that the output current is sensed in both negative-feedback loops, both a voltage and a current derived from the output current being fed back to the input port, as a result of which the amplifier has a high output impedance.

3. A negative-feedback amplifier having an input and an output port providing an output voltage, which amplifier comprises:
   (1) an active amplifier section which has a high loop gain, said active amplifier section including two nullor circuits, each operating approximately as a nullor circuit, said nullor circuits connected to each other in balance,
   (2) a negative-feedback section comprising passive impedances which form two negative-feedback loops in which the output voltage is sensed,
   said negative-feedback loops connected to said nullor circuits so as to form with each nullor circuit
     (a) a parallel-coupling circuit at the input port to feed back a current, derived from the output voltage, to the input port, and
     (b) a series-coupling circuit at the input port to feed back a voltage, derived from the output voltage, to the input port,
     whereby an accurately defined or characteristic input impedance and a low output impedance is produced.

4. A negative-feedback amplifier according to claim 3, characterized in that the output voltage is sensed in both negative-feedback loops, both a current and a voltage derived from the output voltage being fed back to the input port, as a result of which the amplifier has a low output impedance.

5. A negative-feedback amplifier having an input and an output port providing an output current and an output voltage, which comprises:
   (1) an active amplifier section which has a high loop gain, active amplifier section including two nullor circuits, each operating approximately as a nullor circuit, said nullor circuits connected to each other in balance,
   (2) a negative-feedback section comprising passive impedances which form two negative-feedback lops in which both the output current and the output voltage are sensed,
said negative-feedback loops connected to said nullor circuits so as to form with each nullor circuit:
(a) a parallel-coupling circuit at the output port and
(b) a series-coupling circuit at the output port, both circuits feeding back a current, derived from the output current and the output voltage, to the input port,
whereby an accurately defined or characteristic output impedance and a low input impedance is produced.

6. A negative-feedback amplifier according to claim 5, characterized in that both the output current and the output voltage are sensed in said two negative-feedback loops, two currents being derived therefrom which are fed back to the input port, as a result of which the amplifier has a low input impedance.

7. A negative-feedback amplifier having an input and an output port providing an output current and an output voltage, which amplifier comprises:
(1) an active amplifier section which has a high loop gain, said active amplifier section including two nullor circuits, each operating approximately as a nullor circuits, said nullor circuits connected to each other in balance,
(2) a negative-feedback section comprising passive impedances which form two negative-feedback loops in which both the output current and the output voltage are sensed,
said negative-feedback loops connected to said nullor circuits so as to form with each nullor circuit:
(a) a parallel-coupling circuit at the output port, and
(b) a series-coupling circuit at the output port, both circuits feeding back a voltage derived from the output current and the output voltage, to the input port
whereby an accurately defined or characteristic output impedance and a high input impedance is produced.

8. A negative-feedback amplifier according to claim 7, characterized in that both the output current and the output voltage are sensed in said two negative feedback loops a voltage being derived therefrom which is fed back to the input port, as a result of which the amplifier has a high input impedance.

* * * * *

UNITED STATES PATENT AND TRADEMARK OFFICE
CERTIFICATE OF CORRECTION

PATENT NO. : 4,897,610

DATED : January 30, 1990

INVENTOR(S) : Paulus T. M. Van Zeijl

It is certified that error appears in the above-identified patent and that said Letters Patent is hereby corrected as shown below:

Sheets 1 through 6 should be deleted to appear as per attached sheets 1 through 6.

The title page showing the illustrative figure should be deleted to appear as per attached title page.

Signed and Sealed this

Sixteenth Day of April, 1991

Attest:

HARRY F. MANBECK, JR.

*Attesting Officer*   *Commissioner of Patents and Trademarks*

United States Patent [19]

Van Zeijl

[11] Patent Number: 4,897,610
[45] Date of Patent: Jan. 30, 1990

[54] NEGATIVE-FEEDBACK AMPLIFIER WITH ACCURATELY DEFINED INPUT OR OUTPUT IMPEDANCE COMBINED WITH HIGH OR LOW OUTPUT OR INPUT IMPEDANCE RESPECTIVELY

[75] Inventor: Paulus T. M. Van Zeijl, Monster, Netherlands

[73] Assignee: Stichting Voor De Technische Wetenschappen, GA Utrecht, Netherlands

[21] Appl. No.: 187,597

[22] Filed: Apr. 28, 1988

[30] Foreign Application Priority Data

Apr. 29, 1987 [NL] Netherlands ............... 8701026

[51] Int. Cl.$^4$ ............................................ H03F 1/34
[52] U.S. Cl. ...................................... 330/84; 330/102; 330/103; 330/105
[58] Field of Search ............ 330/84, 102, 103, 105, 330/124 R, 146, 295

[56] References Cited

U.S. PATENT DOCUMENTS

| | | | |
|---|---|---|---|
| 3,260,947 | 7/1966 | Dorsman | 330/258 |
| 3,516,006 | 6/1970 | Donjon | 330/84 X |
| 3,566,298 | 2/1971 | Stevens | 330/84 |

FOREIGN PATENT DOCUMENTS

| | | | |
|---|---|---|---|
| 2649965 | 10/1976 | Fed. Rep. of Germany | |
| 0121808 | 7/1983 | Japan | 330/84 |
| 6803097 | 9/1968 | Netherlands | |

OTHER PUBLICATIONS

Hadley, "Isolation Amplifier", *Wireless World*, Jun.-1981, vol. 87, No. 1545, p. 67.
Huijsing et al., "Monolithic Nullor-A Universal Acitve Network", IEEE J. of Solid-State Circuits, vol. SC-12, No. 1, Feb. 1977, pp. 59-64.
Schwartz, "Transactors as Basic Linear Active Network Elements", *Tijoschrift Van Het Nederlands Electronica-en Radiagenootechap*, vol. 32, No. 2, 1967, pp. 45-54.
Electronik, vol. 21, No. 1, Jan. 1872, pp. 33-36.
Yanagisawa et al., "Realization of Arbitrary Conductance Matrix Using Operational Amplifiers" Electronics and Communications in Japan, vol. 59-A, No. 5, May 1976, pp. 45-52.

Primary Examiner—James B. Mullins
Attorney, Agent, or Firm—Rosen, Dainow & Jacobs

[57] ABSTRACT

Negative-feedback amplifier provided with an active amplifier section operating approximately as a nullor and a negative feedback section, the amplifier having a high loop gain. The active amplifier section is constructed in balanced form with two nullors connected in balance, and the negative-feedback section is composed of passive impedances and comprises two negative-feedback loops. In one embodiment each nullor has a series-coupling circuit and a parallel-coupling circuit at the input port. As a result an accurately defined or characteristic input impedance is obtained, and a series- or parallel-coupling circuit is formed in both negative-feedback loops at the output port, so that a high (current output) or low (voltage output) output impedance, respectively is obtained. In another embodiment each nullor has a series-coupling circuit and a parallel-coupling circuit at the output port. As a result an accurately defined or characteristic output impedance is obtained at the amplifier, and a current or voltage related both to the output current and voltage is fed to the input port, so that a low (current input) or high (voltage input) input impedance, respectively is obtained.

8 Claims, 6 Drawing Sheets

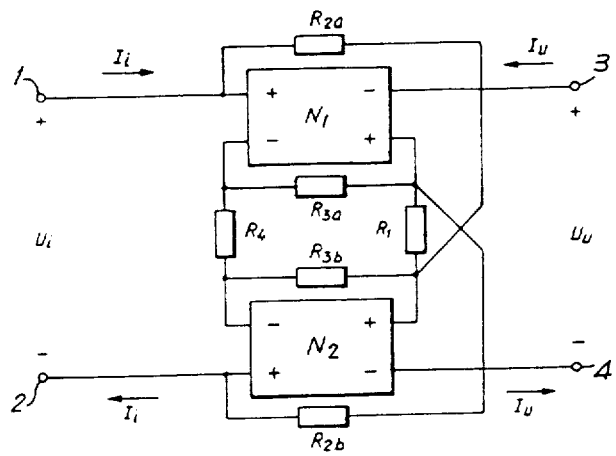

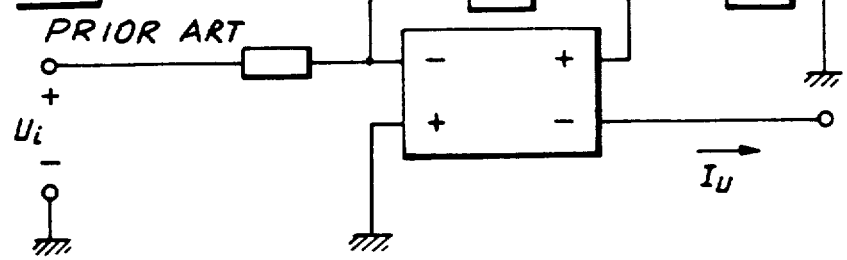
fig-1.1
PRIOR ART
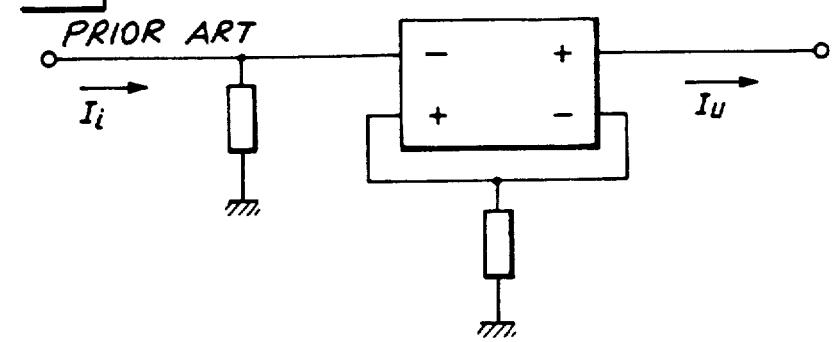
fig-1.2
PRIOR ART
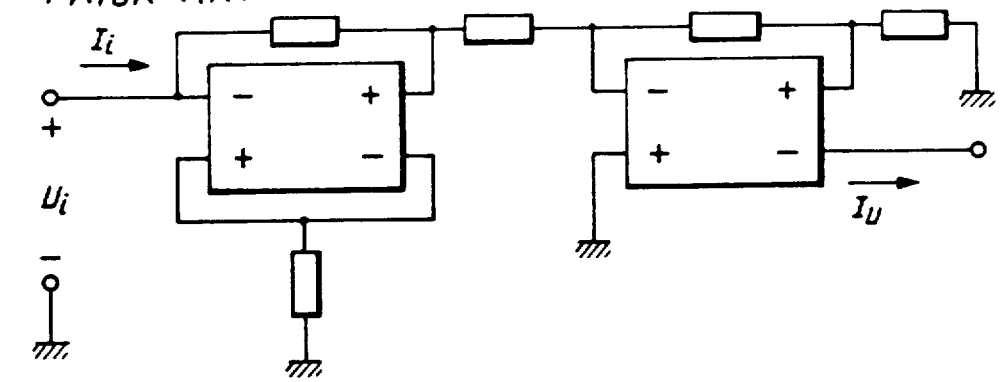
fig-1.3
PRIOR ART
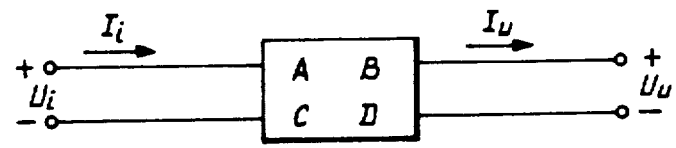
fig-1.4

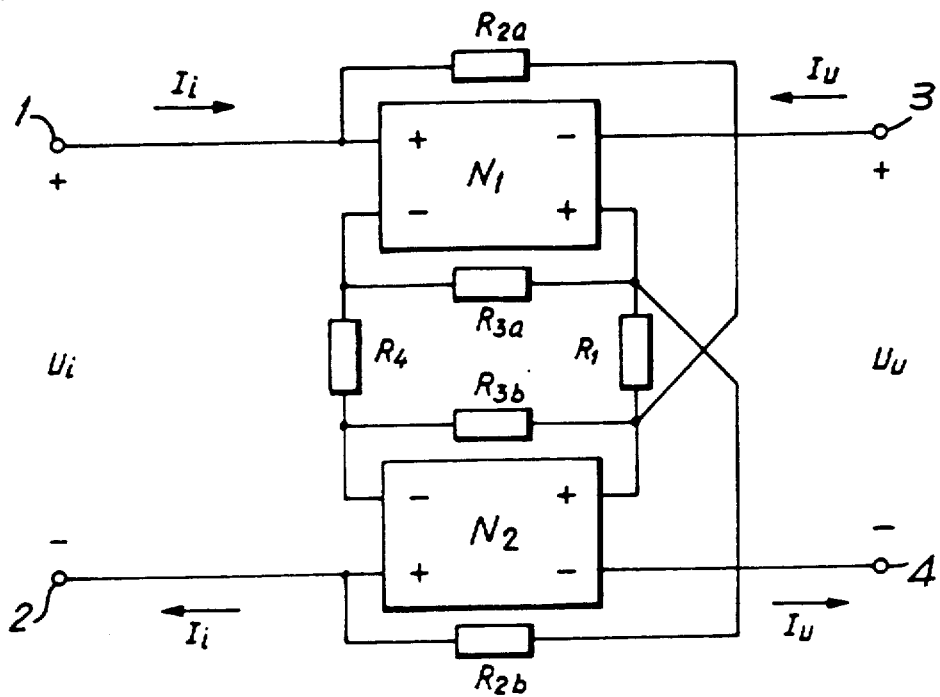
fig-2.1
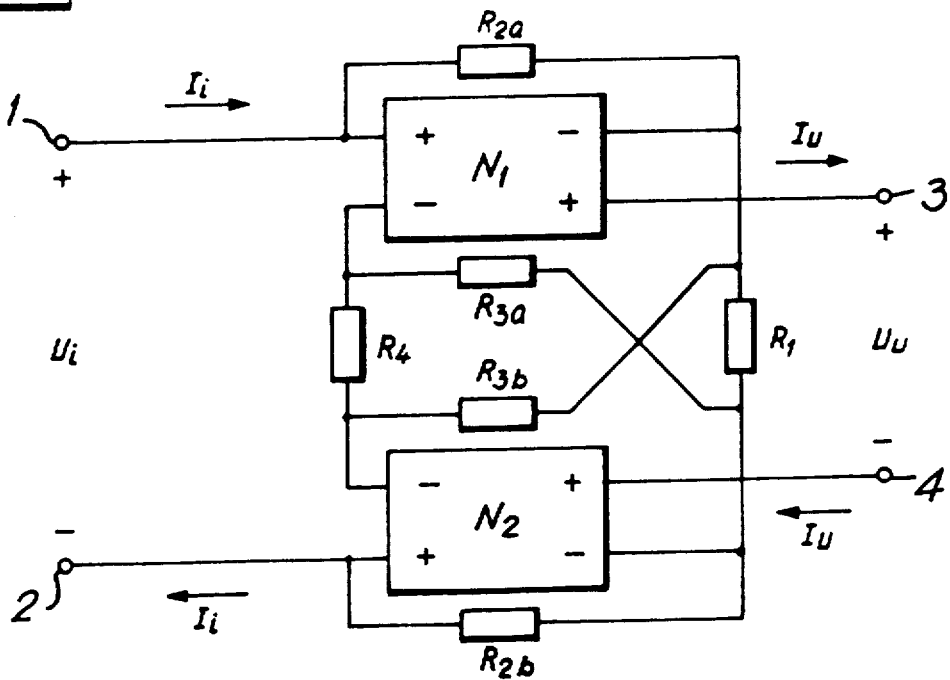
fig-2.2

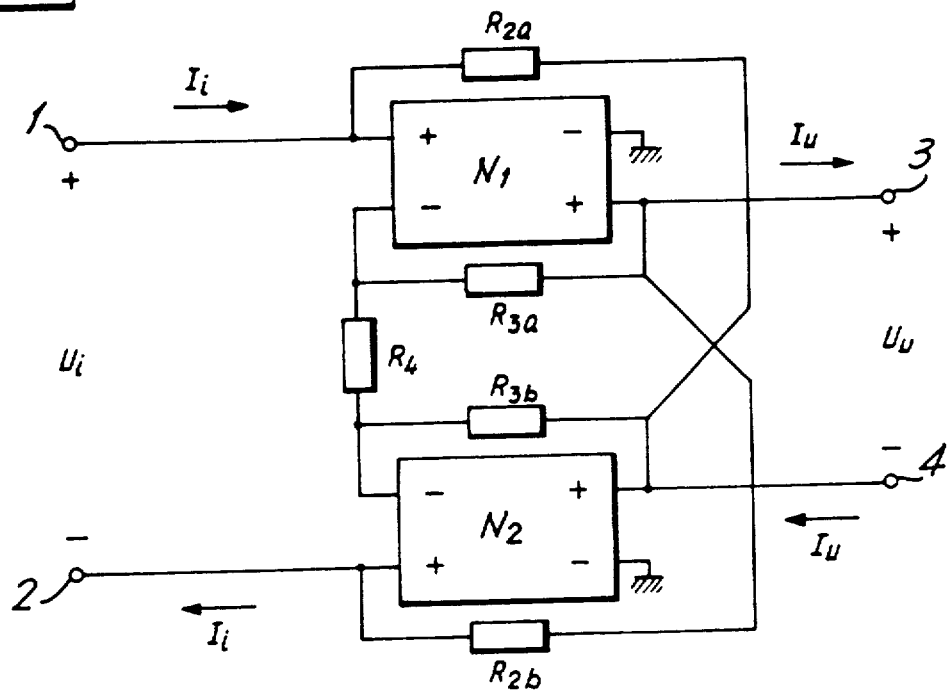
fig-2.3
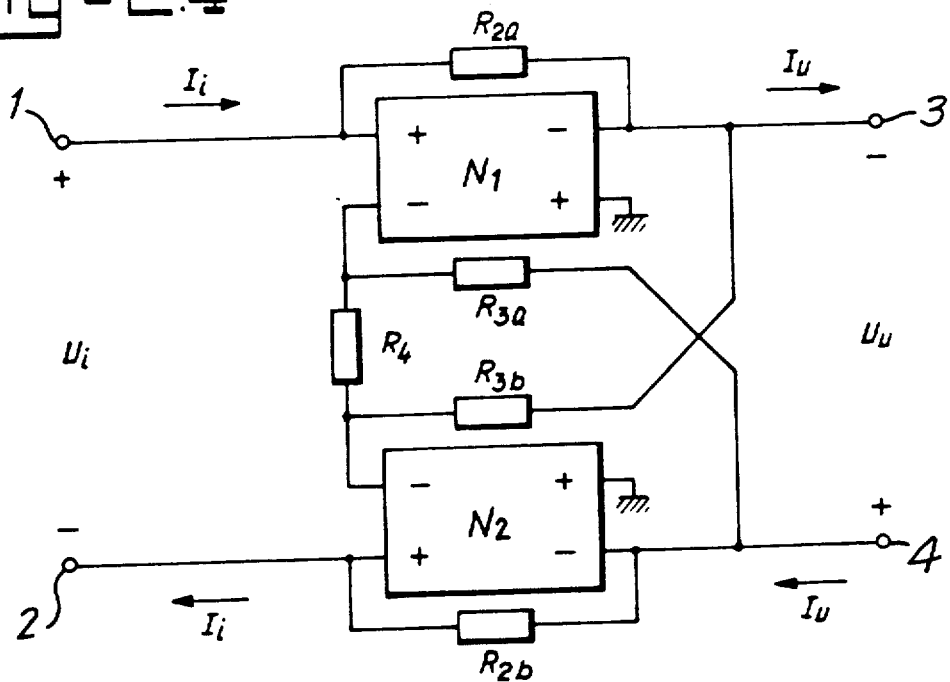
fig-2.4

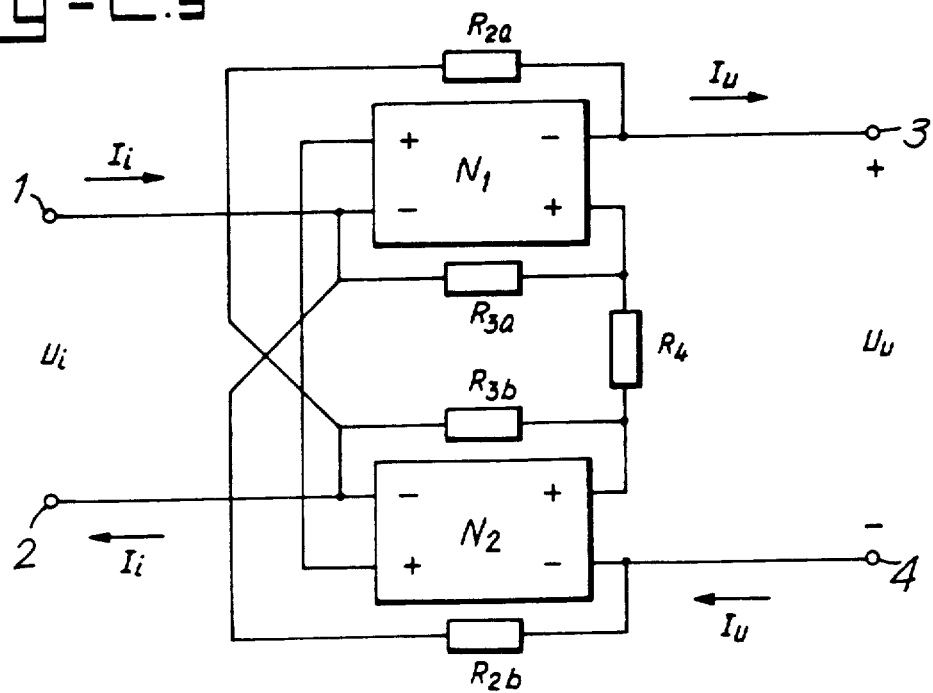
fig-2.5
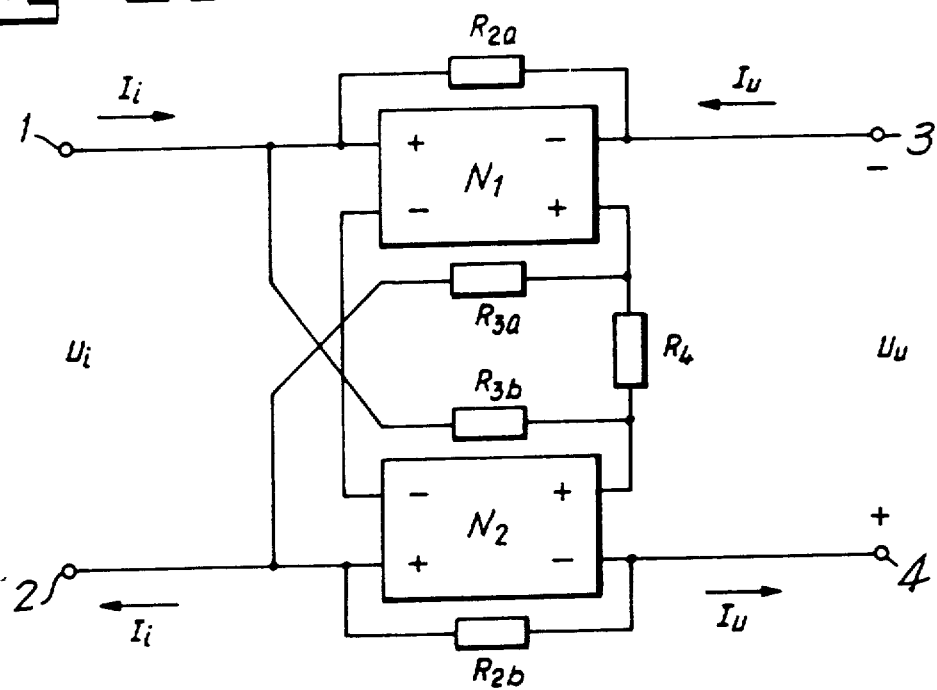
fig-2.6

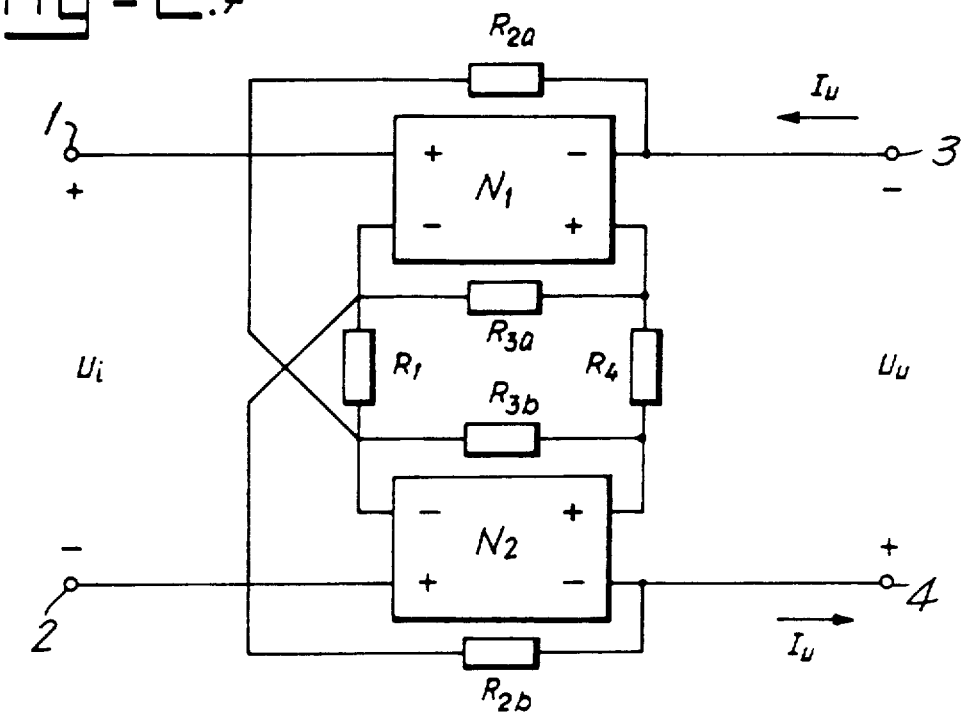
fig-2.7
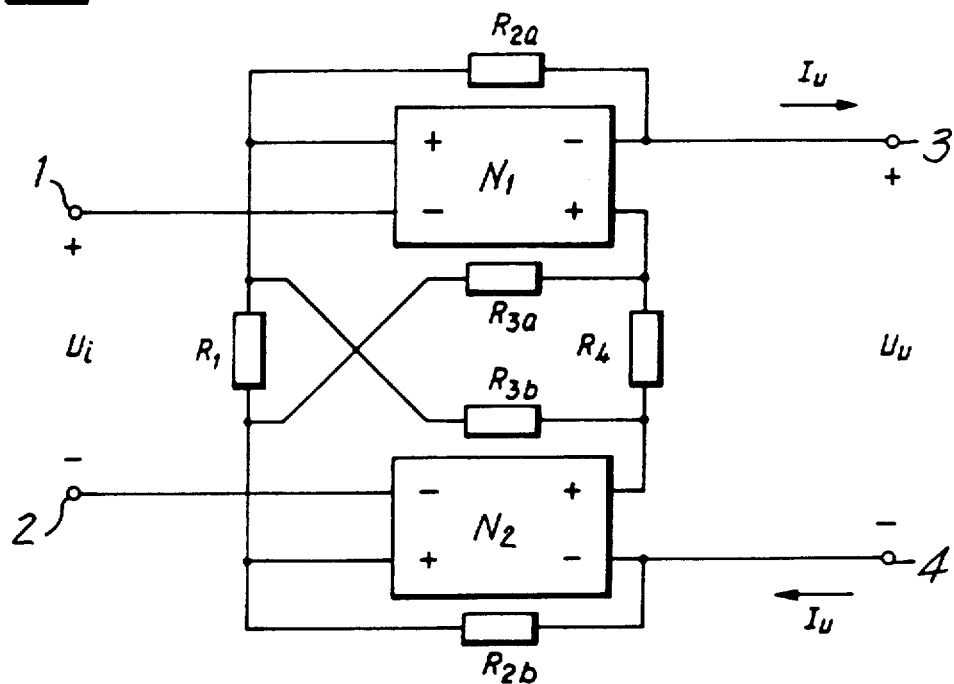
fig-2.8